United States Patent
Chen et al.

(10) Patent No.: US 10,138,117 B2
(45) Date of Patent: Nov. 27, 2018

(54) AQUEOUS FORMULATIONS FOR REMOVING METAL HARD MASK AND POST-ETCH RESIDUE WITH CU/W COMPATIBILITY

(71) Applicant: Entegris, Inc., Billerica, MA (US)

(72) Inventors: Li-Min Chen, Norwalk, CT (US); Steven Lippy, Brookfield, CT (US); Daniela White, Danbury, CT (US); Emanuel I. Cooper, Scarsdale, NY (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 14/908,888

(22) PCT Filed: Jul. 31, 2014

(86) PCT No.: PCT/US2014/049153
§ 371 (c)(1),
(2) Date: Jan. 29, 2016

(87) PCT Pub. No.: WO2015/017659
PCT Pub. Date: Feb. 5, 2015

(65) Prior Publication Data
US 2016/0185595 A1     Jun. 30, 2016

Related U.S. Application Data

(60) Provisional application No. 61/860,385, filed on Jul. 31, 2013.

(51) Int. Cl.
| | |
|---|---|
| *B81C 1/00* | (2006.01) |
| *C09K 13/08* | (2006.01) |
| *G03F 7/40* | (2006.01) |
| *H01L 21/3213* | (2006.01) |
| *C09K 13/10* | (2006.01) |
| *H01L 21/02* | (2006.01) |
| *H01L 21/311* | (2006.01) |

(52) U.S. Cl.
CPC .......... *B81C 1/00539* (2013.01); *C09K 13/08* (2013.01); *C09K 13/10* (2013.01); *G03F 7/405* (2013.01); *H01L 21/02063* (2013.01); *H01L 21/32134* (2013.01); *H01L 21/31144* (2013.01)

(58) Field of Classification Search
None
See application file for complete search history.

(56) References Cited

U.S. PATENT DOCUMENTS

| | | |
|---|---|---|
| 5,320,709 A | 6/1994 | Bowden |
| 5,702,075 A | 12/1997 | Lehrman |
| 5,976,928 A | 11/1999 | Kirlin et al. |
| 5,993,685 A | 11/1999 | Currie et al. |
| 6,194,366 B1 | 2/2001 | Naghshineh et al. |
| 6,211,126 B1 | 4/2001 | Wojtczak et al. |
| 6,224,785 B1 | 5/2001 | Wojtczak et al. |
| 6,280,651 B1 | 8/2001 | Wojtczak et al. |
| 6,306,807 B1 | 10/2001 | Wojtczak et al. |
| 6,322,600 B1 | 11/2001 | Brewer et al. |
| 6,323,168 B1 | 11/2001 | Kloffenstein et al. |
| 6,344,432 B1 | 2/2002 | Wojtczak et al. |
| 6,346,741 B1 | 2/2002 | Van Buskirk et al. |
| 6,379,569 B1 | 4/2002 | Rouberol |
| 6,395,194 B1 | 5/2002 | Russell et al. |
| 6,409,781 B1 | 6/2002 | Wojtczak et al. |
| 6,492,308 B1 | 12/2002 | Naghshineh et al. |
| 6,527,819 B2 | 3/2003 | Wojtczak et al. |
| 6,566,315 B2 | 5/2003 | Wojtczak et al. |
| 6,627,587 B2 | 9/2003 | Naghshineh et al. |
| 6,723,691 B2 | 4/2004 | Naghshineh et al. |
| 6,735,978 B1 | 5/2004 | Tom et al. |
| 6,755,989 B2 | 6/2004 | Wojtczak et al. |
| 6,773,873 B2 | 8/2004 | Seijo et al. |
| 6,800,218 B2 | 10/2004 | Ma et al. |
| 6,802,983 B2 | 10/2004 | Mullee et al. |
| 6,849,200 B2 | 2/2005 | Baum et al. |
| 6,875,733 B1 | 4/2005 | Wojtczak |
| 6,896,826 B2 | 5/2005 | Wojtczak et al. |
| 6,943,139 B2 | 9/2005 | Korzenski et al. |
| 6,989,358 B2 | 1/2006 | Korzenski et al. |
| 7,011,716 B2 | 3/2006 | Xu et al. |
| 7,029,373 B2 | 4/2006 | Ma et al. |
| 7,030,168 B2 | 4/2006 | Xu et al. |
| 7,119,052 B2 | 10/2006 | Korzenski et al. |
| 7,119,418 B2 | 10/2006 | Xu et al. |
| 7,160,815 B2 | 1/2007 | Korzenski et al. |
| 7,223,352 B2 | 5/2007 | Korzenski et al. |
| 7,300,601 B2 | 11/2007 | Liu et al. |
| 7,326,673 B2 | 2/2008 | Xu et al. |
| 7,335,239 B2 | 2/2008 | Baum |
| 7,361,603 B2 | 4/2008 | Liu et al. |
| 7,365,045 B2 | 4/2008 | Walker et al. |
| 7,485,611 B2 | 2/2009 | Roeder et al. |
| 7,534,752 B2 | 5/2009 | Wojtczak et al. |
| 7,553,803 B2 | 6/2009 | Korzenski et al. |
| 7,557,073 B2 | 7/2009 | Korzenski et al. |

(Continued)

FOREIGN PATENT DOCUMENTS

| | | |
|---|---|---|
| EP | 0 937 691 A1 | 8/1999 |
| JP | 2011159658 A | 8/2011 |

(Continued)

OTHER PUBLICATIONS

International Search Report, dated Nov. 26, 2014.

*Primary Examiner* — Allan Olsen
(74) *Attorney, Agent, or Firm* — Entegris, Inc.

(57) ABSTRACT

Compositions useful for the selective removal of titanium nitride and/or photoresist etch residue materials relative to metal conducting, e.g., tungsten, and insulating materials from a microelectronic device having same thereon. The removal compositions are low pH and contain at least one oxidizing agent and at least one etchant as well as corrosion inhibitors to minimize metal erosion and passivating agents to protect dielectric materials.

15 Claims, No Drawings

(56) References Cited

U.S. PATENT DOCUMENTS

| | | |
|---|---|---|
| 7,736,405 B2 | 6/2010 | Darsillo et al. |
| 7,888,301 B2 | 2/2011 | Bernhard et al. |
| 7,922,824 B2 | 4/2011 | Minsek et al. |
| 7,923,423 B2 | 4/2011 | Walker et al. |
| 7,960,328 B2 | 6/2011 | Visintin et al. |
| 8,026,200 B2 | 9/2011 | Cooper et al. |
| 8,058,219 B2 | 11/2011 | Rath et al. |
| 8,114,220 B2 | 2/2012 | Visintin et al. |
| 8,178,585 B2 | 5/2012 | Petruska et al. |
| 8,236,485 B2 | 8/2012 | Minsek et al. |
| 8,304,344 B2 | 11/2012 | Boggs et al. |
| 8,338,087 B2 | 12/2012 | Rath et al. |
| 8,367,555 B2 | 2/2013 | Afzali-Ardakani et al. |
| 8,618,036 B2 | 12/2013 | Afzali-Ardakani et al. |
| 8,685,909 B2 | 4/2014 | Angst et al. |
| 8,754,021 B2 | 6/2014 | Barnes et al. |
| 8,778,210 B2 | 7/2014 | Cooper et al. |
| 8,951,948 B2 | 2/2015 | Rath et al. |
| 9,045,717 B2 | 6/2015 | Nakanishi et al. |
| 9,063,431 B2 | 6/2015 | Barnes et al. |
| 9,074,169 B2 | 7/2015 | Chen et al. |
| 9,074,170 B2 | 7/2015 | Barnes et al. |
| 9,175,404 B2 | 11/2015 | Kojima et al. |
| 9,215,813 B2 | 12/2015 | Brosseau et al. |
| 9,221,114 B2 | 12/2015 | Chen et al. |
| 9,238,850 B2 | 1/2016 | Korzenski et al. |
| 2004/0116313 A1* | 6/2004 | Nosowitz ............ H01L 21/3212 510/175 |
| 2004/0154641 A1 | 8/2004 | Montierth |
| 2005/0118832 A1 | 6/2005 | Korzenski et al. |
| 2005/0145311 A1 | 7/2005 | Walker et al. |
| 2005/0227482 A1 | 10/2005 | Korzenski et al. |
| 2005/0263490 A1 | 12/2005 | Liu et al. |
| 2006/0019850 A1 | 1/2006 | Korzenski et al. |
| 2006/0063687 A1 | 3/2006 | Minsek et al. |
| 2006/0148666 A1 | 7/2006 | Peters et al. |
| 2006/0154186 A1 | 7/2006 | Minsek et al. |
| 2006/0196778 A1* | 9/2006 | Jia ............................ B23H 5/08 205/640 |
| 2006/0249482 A1 | 11/2006 | Wrschka et al. |
| 2007/0049025 A1* | 3/2007 | Siddiqui ................. C09G 1/02 438/687 |
| 2007/0054495 A1* | 3/2007 | Compton ................ C09G 1/02 438/693 |
| 2007/0082497 A1 | 4/2007 | Lee et al. |
| 2007/0117396 A1 | 5/2007 | Wu et al. |
| 2007/0251551 A1 | 11/2007 | Korzenski et al. |
| 2008/0076688 A1 | 3/2008 | Barnes et al. |
| 2008/0125342 A1 | 5/2008 | Visintin et al. |
| 2008/0271991 A1 | 11/2008 | Korzenski et al. |
| 2009/0032766 A1 | 2/2009 | Rajaratnam et al. |
| 2009/0082240 A1 | 3/2009 | Nukui et al. |
| 2009/0124173 A1* | 5/2009 | Li ........................ B24B 37/044 451/37 |
| 2009/0192065 A1 | 7/2009 | Korzenski et al. |
| 2009/0212021 A1 | 8/2009 | Bernhard et al. |
| 2009/0215269 A1 | 8/2009 | Boggs et al. |
| 2009/0253072 A1 | 10/2009 | Petruska et al. |
| 2009/0301996 A1 | 12/2009 | Visintin et al. |
| 2010/0056410 A1 | 3/2010 | Visintin et al. |
| 2010/0065530 A1 | 3/2010 | Walker et al. |
| 2010/0087065 A1 | 4/2010 | Boggs et al. |
| 2010/0112728 A1 | 5/2010 | Korzenski et al. |
| 2010/0163788 A1 | 7/2010 | Visintin et al. |
| 2010/0261632 A1 | 10/2010 | Korzenski et al. |
| 2010/0286014 A1 | 11/2010 | Barnes |
| 2011/0039747 A1 | 2/2011 | Zhou et al. |
| 2011/0117751 A1 | 5/2011 | Sonthalia et al. |
| 2013/0270217 A1 | 10/2013 | Yoshida et al. |
| 2013/0280123 A1 | 10/2013 | Chen et al. |
| 2013/0295712 A1 | 11/2013 | Chen et al. |
| 2013/0303420 A1 | 11/2013 | Cooper et al. |
| 2013/0344696 A1* | 12/2013 | Li ..................... H01L 21/76898 438/693 |
| 2014/0038420 A1 | 2/2014 | Chen et al. |
| 2014/0306162 A1 | 10/2014 | Poe et al. |
| 2014/0318584 A1 | 10/2014 | Cooper et al. |
| 2014/0319423 A1 | 10/2014 | Cooper |
| 2015/0027978 A1 | 1/2015 | Barnes et al. |
| 2015/0045277 A1 | 2/2015 | Liu et al. |
| 2015/0050199 A1 | 2/2015 | Korzenski et al. |
| 2015/0075570 A1 | 3/2015 | Wu et al. |
| 2015/0114429 A1 | 4/2015 | Jenq et al. |
| 2015/0162213 A1 | 6/2015 | Chen et al. |
| 2015/0168843 A1 | 6/2015 | Cooper et al. |
| 2015/0344825 A1 | 12/2015 | Cooper et al. |
| 2016/0020087 A1 | 1/2016 | Liu et al. |
| 2016/0032186 A1 | 2/2016 | Chen et al. |
| 2016/0075971 A1 | 3/2016 | Liu et al. |
| 2016/0122696 A1 | 5/2016 | Liu et al. |
| 2016/0130500 A1 | 5/2016 | Chen et al. |

FOREIGN PATENT DOCUMENTS

| | | |
|---|---|---|
| JP | 2012021151 A | 2/2012 |
| JP | 2012062572 A | 3/2012 |
| JP | 2012186470 A | 9/2012 |
| JP | 2012251026 A | 12/2012 |
| WO | 2006110645 A2 | 10/2006 |
| WO | 2006127885 A1 | 11/2006 |
| WO | 2007027522 A2 | 3/2007 |
| WO | 2008036823 A2 | 3/2008 |
| WO | 2008157345 A2 | 12/2008 |
| WO | 2009073596 A2 | 6/2009 |
| WO | 2010017160 A2 | 2/2010 |
| WO | 2010039936 A2 | 4/2010 |
| WO | 2010086745 A1 | 8/2010 |
| WO | 2010091045 A2 | 8/2010 |
| WO | WO-2012009639 A2 * | 1/2012 ....... H01L 21/02063 |
| WO | 2012154498 A2 | 11/2012 |
| WO | 2012174518 A2 | 12/2012 |
| WO | 2013058770 A1 | 4/2013 |
| WO | 2013101907 A1 | 7/2013 |
| WO | 2013138278 A1 | 9/2013 |
| WO | 2015/017659 A1 | 2/2015 |

* cited by examiner

AQUEOUS FORMULATIONS FOR REMOVING METAL HARD MASK AND POST-ETCH RESIDUE WITH CU/W COMPATIBILITY

CROSS-REFERENCE TO RELATED APPLICATIONS

This application is filed under the provisions of 35 U.S.C. § 371 and claims the priority of International Patent Application No. PCT/US2014/049153 filed on 31 Jul. 2014 entitled "AQUEOUS FORMULATIONS FOR REMOVING METAL HARD MASK AND POST-ETCH RESIDUE WITH Cu/W COMPATIBILITY" in the name of Li-Min CHEN, et al., which claims priority to U.S. Provisional Patent Application No. 61/860,385 filed on 31 Jul. 2013, both of which are hereby incorporated by reference herein in their entirety.

FIELD

The present invention relates to a composition and process for selectively etching titanium nitride and/or photoresist etch residues in the presence of metal conductor and insulator materials (i.e., low-k dielectrics), and more particularly to a composition and process for effectively and efficiently etching titanium nitride and/or photoresist etch residues at an etch rate and selectivity that is higher than that of exposed or underlying layers of copper, tungsten, and low-k dielectric materials.

DESCRIPTION OF THE RELATED ART

Photoresist masks are commonly used in the semiconductor industry to pattern materials such as semiconductors or dielectrics. In one application, photoresist masks are used in a dual damascene process to form interconnects in the back-end metallization of a microelectronic device. The dual damascene process involves forming a photoresist mask on a low-k dielectric layer overlying a metal conductor layer, such as a copper layer. The low-k dielectric layer is then etched according to the photoresist mask to form a via and/or trench that expose the metal conductor layer. The via and trench, commonly known as dual damascene structure, are usually defined using two lithography steps. The photoresist mask is then removed from the low-k dielectric layer before a conductive material is deposited into the via and/or trench to form an interconnect.

With the decreasing size of microelectronic devices, it becomes more difficult to achieve the critical dimensions for vias and trenches. Thus, metal hard masks are used to provide better profile control of vias and trenches. The metal hard masks can be made of titanium or titanium nitride, and are removed by a wet etching process after forming the via and/or trench of the dual damascene structure. It is essential that the wet etching process uses a removal chemistry that effectively removes the metal hard mask and/or photoresist etch residues without affecting the underlying metal conductor layer and low-k dielectric material. In other words, the removal chemistry is required to be highly selective to the metal conductor layer and low-k dielectric layer.

Accordingly, an object of the present invention is to provide improved compositions for the selective removal of hard mask materials relative to metal conductor layers and low-k dielectric layers that are present, while not compromising the etch rate of the hard mask.

SUMMARY OF THE INVENTION

The present invention relates to a composition and process for selectively etching hard mask layers and/or photoresist etch residues relative to metal conductor layers and low-k dielectric layers that are present. More specifically, the present invention relates to a composition and process for selectively etching titanium nitride and/or photoresist etch residues while simultaneously being compatible with copper, tungsten, and low-k dielectric layers.

In one aspect, a composition for selectively removing titanium nitride and/or photoresist etch residue material from the surface of a microelectronic device having same thereon is described, said composition comprising at least one oxidizing agent, at least one etchant, at least one corrosion inhibitor, at least one passivating agent, at least one solvent, and optionally at least one complexing agent, wherein the composition is substantially devoid of hydrogen peroxide.

In another aspect, a composition for selectively removing titanium nitride and/or photoresist etch residue material from the surface of a microelectronic device having same thereon is described, said composition comprising at least one iodine-containing oxidizing agent, at least one etchant, at least one corrosion inhibitor, at least one passivating agent, at least one solvent, at least one iodine scavenger, and optionally at least one complexing agent, wherein the composition is substantially devoid of hydrogen peroxide.

In still another aspect, a method of etching titanium nitride material from a surface of a microelectronic device having same thereon is described, said method comprising contacting the surface with a composition comprising at least one oxidizing agent, at least one etchant, at least one corrosion inhibitor, at least one passivating agent, at least one solvent, and optionally at least one complexing agent, wherein the composition is substantially devoid of hydrogen peroxide, wherein the composition selectively removes the titanium nitride material from the surface relative to metals and insulating materials.

In yet another aspect, a method of etching titanium nitride material from a surface of a microelectronic device having same thereon is described, said method comprising contacting the surface with a composition comprising at least one iodine-containing oxidizing agent, at least one etchant, at least one corrosion inhibitor, at least one passivating agent, at least one iodine scavenger, at least one solvent, and optionally at least one complexing agent, wherein the composition is substantially devoid of hydrogen peroxide, wherein the composition selectively removes the titanium nitride material from the surface relative to metals and insulating materials.

Other aspects, features and embodiments of the invention will be more fully apparent from the ensuing disclosure and appended claims.

DETAILED DESCRIPTION, AND PREFERRED EMBODIMENTS THEREOF

In general, the present invention relates to compositions and processes for selectively etching hard mask layers and/or photoresist etch residues relative to metal conductor layers and low-k dielectric layers that are present. More specifically, the present invention relates to a composition and process for selectively etching titanium nitride and/or photoresist etch residues relative to copper, tungsten, and low-k dielectric layers. Other materials that may be present on the microelectronic device, should not be substantially removed or corroded by said compositions.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

"Hardmask capping layer" as used herein corresponds to materials deposited over dielectric material to protect same during the plasma etch step. Hardmask capping layers are traditionally silicon nitrides, silicon oxynitrides, titanium nitride, titanium oxynitride, titanium and other similar compounds.

As used herein, "titanium nitride" and "$TiN_x$" correspond to pure titanium nitride as well as impure titanium nitride including varying stoichiometries, and oxygen content ($Ti-O_xN_y$)

As used herein, "about" is intended to correspond to ±5% of the stated value.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "metal conductor layers" comprise copper, tungsten, cobalt, molybdenum, aluminum, ruthenium, alloys comprising same, and combinations thereof.

As defined herein, "amine" species include at least one primary, secondary, and tertiary amines, with the proviso that (i) species including both a carboxylic acid group and an amine group (e.g., amino acids, aminopolycarboxylic acids, etc.), (ii) surfactants that include amine groups (e.g., ether amines such as Tomamine® (Air Products) and amine oxide surfactants), (iii) species where the amine group is a substituent (e.g., attached to an aryl or heterocyclic moiety), (iv) amine-N-oxides, and (v) pyridine and pyridine derivatives are not considered "amines" according to this definition. The amine formula is represented by $NR^1R^2R^3$, wherein $R^1$, $R^2$ and $R^3$ can be the same as or different from one another and are selected from the group consisting of hydrogen, straight-chained or branched $C_1$-$C_6$ alkyls (e.g., methyl, ethyl, propyl, butyl, pentyl, hexyl), $C_6$-$C_{10}$ aryls (e.g., benzyl), straight-chained or branched $C_1$-$C_6$ alkanols (e.g., methanol, ethanol, propanol, butanol, pentanol, hexanol), and combinations thereof, with the proviso that $R^1$, $R^2$ and $R^3$ cannot all be hydrogen.

As defined herein, "photoresist etch residues" corresponds to any residue comprising photoresist material, or material that is a by-product of photoresist subsequent to an etching or ashing step, as readily understood by the person skilled in the art.

"Substantially devoid" is defined herein as less than 2 wt. %, preferably less than 1 wt. %, more preferably less than 0.5 wt. %, even more preferably less than 0.1 wt. %, and most preferably 0 wt. %.

As used herein, "fluoride" species correspond to species including an ionic fluoride ($F^-$) or covalently bonded fluorine. It is to be appreciated that the fluoride species may be included as fluoride species or generated in situ.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.0001 weight percent, based on the total weight of the composition in which such components are employed.

Embodiments of the present invention include a chemistry for removing hard mask and/or photoresist etch residues. In one embodiment, the removal composition is a wet-etch solution that removes a metal hard mask and/or photoresist etch residues on a dielectric layer and is highly selective to a metal conductor layer underneath the dielectric layer and the dielectric layer itself. In a more specific embodiment, the removal composition is a wet-etch solution that removes a titanium nitride layer and/or photoresist etch residues that is highly selective to at least one of copper, tungsten, and low-k dielectric materials.

In one aspect, a composition for selectively removing titanium nitride and/or photoresist etch residue material from the surface of a microelectronic device having same thereon is described, said composition comprising, consisting of, or consisting essentially of at least one oxidizing agent, at least one etchant, at least one corrosion inhibitor, at least one passivating agent, at least one solvent, and optionally at least one complexing agent, wherein the composition is substantially devoid of hydrogen peroxide. In another embodiment, the composition of the first aspect comprises, consists of, or consists essentially of at least one iodine-containing oxidizing agent, at least one etchant, at least one corrosion inhibitor, at least one passivating agent, at least one solvent, at least one iodine scavenger, and optionally at least one complexing agent, wherein the composition is substantially devoid of hydrogen peroxide. Preferably, the compositions comprise at least 95 wt % water, more preferably at least 97 wt % water, and most preferably at least 98 wt % water, based on the total weight of the composition. Advantageously, the compositions have a TiN to tungsten selectivity of greater than 50:1 and a tungsten removal rate less than 2 Å $min^{-1}$. The compositions are substantially devoid of amines, as defined herein, abrasive materials, metal halides, and combinations thereof. The compositions have pH value in a range from 0 to 4, preferably 1 to 3.

Etchants are added to increase the etch rate of the titanium nitride. Etchants contemplated include, but are not limited to, HF, ammonium fluoride, tetrafluoroboric acid, hexafluorosilicic acid, other compounds containing B—F or Si—F bonds, tetrabutylammonium tetrafluoroborate (TBA-$BF_4$), tetraalkylammonium fluoride ($NR_1R_2R_3R_4F$), strong bases such as tetraalkylammonium hydroxide ($NR_1R_2R_3R_4OH$), where $R_1$, $R_2$, $R_3$, $R_4$ may be the same as or different from one another and is selected from the group consisting of hydrogen, straight-chained or branched $C_1$-$C_6$ alkyl groups (e.g., methyl, ethyl, propyl, butyl, pentyl, hexyl), $C_1$-$C_6$ alkoxy groups (e.g., hydroxyethyl, hydroxypropyl) substituted or unsubstituted aryl groups (e.g., benzyl), weak bases, and combinations thereof. Preferably, the fluoride source comprises HF, tetrafluoroboric acid, hexafluorosilicic acid, $H_2ZrF_6$, $H_2TiF_6$, $HPF_6$, ammonium fluoride, tetramethylammonium fluoride, tetramethylammonium hydroxide, ammonium hexafluorosilicate, ammonium hexafluorotitanate, or a combination of ammonium fluoride and tetramethylammonium fluoride. Most preferably, the etchant comprises HF, hexafluorosilicic acid or tetrafluoroboric acid.

Compositions of the first aspect include at least one low-k passivating agent to reduce the chemical attack of the low-k dielectric layers and to protect the wafer from additional oxidation. Preferred low-k passivating agent include, but are not limited to, boric acid, borate salts, (e.g., ammonium pentaborate, sodium tetraborate, ammonium biborate), alkoxysilanes (e.g., methyltrimethoxysilane, dimethyldimethoxysilane, phenyltrimethoxysilane, tetraethoxysilane (TEOS), N-propyltrimethoxysilane, N-propyltriethoxysilane, hexyltrimethoxysilane, hexyltriethoxysilane, ammonium hexaflurorosilicate, sodium silicate, tetramethyl ammonium silicate (TMAS)), 3-hydroxy-2-naphthoic acid, malonic acid, and iminodiacetic acid. Preferably, less than 2 wt. % of the underlying low-k material is etched/removed using the compositions described herein, more preferably less than 1 wt. %, most preferably less than 0.5 wt. %, based on the total weight of the underlying low-k material. It should be appreciated by the skilled artisan that the combination of hydrofluoric acid and boric acid (or borate salts) will result in the formation of tetrafluoroboric acid. It should also be appreciated by the skilled artisan that the combination of hydrofluoric acid and the alkoxysilane will result in the formation of hexafluorosilicic acid.

Oxidizing agents are included to oxidize $Ti^{3+}$ in $TiN_x$. Oxidizing agents contemplated herein include, but are not limited to, hydrogen peroxide ($H_2O_2$), $FeCl_3$, $FeF_3$, $Fe(NO_3)_3$, $Sr(NO_3)_2$, $CoF_3$, $MnF_3$, oxone ($2KHSO_5.KHSO_4.K_2SO_4$), periodic acid, iodic acid, vanadium (V) oxide, vanadium (IV,V) oxide, ammonium vanadate, ammonium polyatomic salts (e.g., ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$), ammonium perborate ($NH_4BO_3$), ammonium perchlorate ($NH_4ClO_4$), ammonium periodate ($NH_4IO_4$), ammonium persulfate (($NH_4)_2S_2O_8$), ammonium hypochlorite ($NH_4ClO$)), ammonium tungstate (($NH_4)_{10}H_2(W_2O_7)$)), sodium polyatomic salts (e.g., sodium persulfate ($Na_2S_2O_8$), sodium hypochlorite (NaClO), sodium perborate), potassium polyatomic salts (e.g., potassium iodate ($KIO_3$), potassium permanganate ($KMnO_4$), potassium persulfate, nitric acid ($HNO_3$), potassium persulfate ($K_2S_2O_8$), potassium hypochlorite (KClO)), tetramethylammonium polyatomic salts (e.g., tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$)), tetrabutylammonium polyatomic salts (e.g., tetrabutylammonium peroxomonosulfate), peroxomonosulfuric acid, ferric nitrate ($Fe(NO_3)_3$), urea hydrogen peroxide (($CO(NH_2)_2)H_2O_2$), peracetic acid ($CH_3(CO)OOH$), 1,4-benzoquinone, toluquinone, dimethyl-1,4-benzoquinone, chloranil, alloxan, and combinations thereof. When the oxidizing agent is a salt it can be hydrated or anhydrous. The oxidizing agent may be introduced to the composition at the manufacturer, prior to introduction of the composition to the device wafer, or alternatively at the device wafer, i.e., in situ. Preferably, the oxidizing agent for the composition of the second aspect comprises hydrogen peroxide. Preferably, the oxidizing agent for the composition of the first aspect comprises an amine-N-oxide, vanadium oxide, ammonium iodate, ammonium periodate, iodic acid, or periodic acid.

Metal corrosion inhibitors are added to block the oxidative activity of the oxidizing agent(s) and the carboxylate salt(s) (when present). Metal corrosion inhibitors contemplated herein include, but are not limited to, 5-amino-1,3,4-thiadiazole-2-thiol (ATDT), benzotriazole (BTA), 1,2,4-triazole (TAZ), tolyltriazole, 5-methyl-benzotriazole (MBTA), 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-aminotetrazole, pentylenetetrazole, 5-phenyl-1H-tetrazole, 5-benzyl-1H-tetrazole, Ablumine O (Taiwan Surfactant), succinimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, benzothiazole, imidazole, indiazole, adenosine, carbazole, saccharin, benzoin oxime, amine-N-oxides (e.g., N-methylmorpholine N-oxide (NMMO), trimethylamine N-oxide, triethylamine-N-oxide, pyridine-N-oxide, N-ethylmorpholine-N-oxide, N-methylpyrrolidine-N-oxide, and N-ethylpyrrolidine-N-oxide), and combinations thereof. Additional corrosion inhibitors include cationic quaternary salts such as benzalkonium chloride, benzyldimethyldodecylammonium chloride, myristyltrimethylammonium bromide, dodecyltrimethylammonium bromide, hexadecylpyridinium chloride, Aliquat 336 (Cognis), benzyldimethylphenylammonium chloride, Crodaquat TES (Croda Inc.), Rewoquat CPEM (Witco), hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzyldimethylhexadecylammonium chloride, benzyldimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldimethylammonium bromide, dodecyltrimethylammonium chloride (DTAC), ethylhexadecyldimethylammonium bromide, dodecyl(2-hydroxyethyl)dimethyl ammonium bromide, hexadecyl(2-hydroxyethyl)dimethyl ammonium chloride, cetyltrimethylammonium p-toluenesulfonate, dodecylpyridium (laurylpyridinium) chloride, dodecyltrimethylammonium methanesulfonate, dodecyltrimethylammonium p-toluenesulfonate, [9-(2-carboxyphenyl)-6-diethylamino-3-xanthenylidene]-diethylammonium chloride (Rhodamine B) Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis (decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate. 1-decyl-3-methylimidazolium chloride, tridodecylmethylammonium bromide, dimethyldistearylammonium chloride, and hexamethonium chloride. Other corrosion inhibitors include non-ionic surfactants such as PolyFox PF-159 (OMNOVA Solutions), poly(ethylene glycol) ("PEG"), poly(propylene glycol) ("PPG"), PEG-PPG copolymers such as Pluronic F-127 (BASF), anionic surfactants such as dodecylbenzenesulfonic acid, sodium dodecyl sulfate, sodium dodecylbenzenesulfonate, and combinations thereof. The quaternary salts can function as both corrosion inhibitors (especially for copper and tungsten) and wetting agents. Preferred tungsten corrosion inhibitors include Tomamine® ether amines including, but not limited to ether quaternary amines (e.g., the Q-series such as isodecyloxypropyl bis-(2-hydroxyethyl) methyl ammonium chloride, isotridecyloxypropyl bis-(2-hydroxyethyl) methyl ammonium chloride, mono soya methyl ammonium chloride, tallow diamine diquaternary, coco poly(15) oxyethylene methyl ammonium chloride), ether amine oxides (e.g., the AO series such as bis-(2-hydroxyethyl) isodecyloxypropylamine oxide, linear alkyloxypropylamine oxide, low-foam alkyloxypropylamine oxide (AO-405 and AO-455), and combinations thereof. Other amine oxide surfactants will also be useful tungsten corrosion inhibitors including, but not limited to, dodecyldimethylamine oxide, bis-(2-hydroxyethyl)-Cocoalkylamine Oxide (Aromox® C/12 W, Azko Nobel), dimethylcocoalkylamine oxide (Aromox® DMC), 4-(benzyloxy) pyridine N-oxide, 4-(3-phenylpropyl)pyridine N-oxide, and combinations thereof. Other useful tungsten corrosion inhibitors include heterocycles such as pyridine, quinoline, quinazoline, isoquinoline, pyrazine, pyrimidine, pyridazine, quinoxaline, phenazine, phenanthridine, 2,2'-pyridine, 1,4'-pyridine, 4,4'-pyridine, and acridine, as well as derivatives of the heterocycles including at least one of $C_{1-6}$ alkyls, phenyl, benzyl, phenethyl, 3-phenylpropyl, benzyloxy, carboxyl, chloro, bromo, methoxy, nitro, and cyano groups, including, but not limited to, 2-benzylpyridine, and 4-(4-nitrobenzyl)pyridine, It will be obvious to those skilled in the art that, while quaternary salts are available commercially most often as chlorides or bromides, it is easy to ion-exchange the halide anion with non-halide anions such as sulfate, methanesulfonate, nitrate, hydroxide, etc. Such converted quaternary salts are also contemplated and preferred herein. Preferred corrosion inhibitors include the cationic quaternary salts, more preferably myristyltrimethylammonium bromide, benzalkonium chloride, hexadecyltrimethylammonium p-toluenesulfonate, DTAC, and hexadecyltrimethylammonium hydroxide, wherein the chlorides have been ion exchanged prior to use. Alternatively, preferred corrosion inhibitors include 5-methyl-benzotriazole, and tetrazoles such as 5-benzyl-1H-tetrazole. In still another alternative, the preferred corrosion inhibitors include amine-N-oxides, amine oxide surfactants and/or Tomamine® ether amines wherein the chlorides have been ion-exchanged.

The at least one solvent can comprise water, at least one water-miscible organic solvent, or a combination thereof, wherein the at least one water-miscible organic solvent is selected from the group consisting of a compound of formula $R^1R^2R^3C(OH)$, where $R^1$, $R^2$ and $R^3$ are independent from each other and are selected from the group consisting of hydrogen, $C_2$-$C_{30}$ alkyls, $C_2$-$C_{30}$ alkenes, cycloalkyls, $C_2$-$C_{30}$alkoxys, and combinations thereof. For example, the at least one solvent can comprise at least one species selected from the group consisting of water, methanol, ethanol, isopropanol, butanol, and higher alcohols, tetrahydrofurfuryl alcohol (THFA), 3-chloro-1,2-propanediol, 3-chloro-1-propanethiol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 4-chloro-1-butanol, 2-chloroethanol), dichloromethane, chloroform, acetic acid, propionic acid, trifluoroacetic acid, tetrahydrofuran (THF), N-methylpyrrolidinone (NMP), cyclohexylpyrrolidinone, N-octylpyrrolidinone, N-phenylpyrrolidinone, methyldiethanolamine, methyl formate, dimethyl formamide (DMF), dimethylsulfoxide (DMSO), tetramethylene sulfone (sulfolane), diethyl ether, phenoxy-2-propanol (PPh), propriophenone, ethyl lactate, ethyl acetate, ethyl benzoate, acetonitrile, acetone, ethylene glycol, propylene glycol (PG), 1,3-propanediol, 1,4-propanediol, dioxane, butyryl lactone, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, dipropylene glycol methyl ether acetate, tetraethylene glycol dimethyl ether (TEGDE), dibasic ester, glycerine carbonate, N-formyl morpholine, triethyl phosphate, and combinations thereof. Preferably, the at least one solvent comprises water, most preferably deionized water.

Complexing agents, when present, are added to reduce particle generation and growth and to improve shelf life of the composition. Chelating agents contemplated include, but are not limited to, β-diketonate compounds such as 2,4-pentanedione, acetylacetonate, 1,1,1-trifluoro-2,4-pentanedione, and 1,1,1,5,5,5-hexafluoro-2,4-pentanedione; amino acids such as glycine, serine, proline, leucine, alanine, asparagine, aspartic acid, glutamine, histidine, glutamic acid, arginine, cysteine, valine, and lysine; polyprotic and aminopolycarboxylic acids selected from the group consisting of iminodiacetic acid (IDA), malonic acid, oxalic acid, succinic acid, boric acid, nitrilotriacetic acid, malic acid, citric acid, acetic acid, maleic acid, ethylenediaminetetraacetic acid (EDTA), EDTA-2NH$_3$ (ethylenediaminetetraacetic acid diammonium salt), (1,2-cyclohexylenedinitrilo)tetraacetic acid (CDTA), diethylenetriamine pentaacetic acid (DTPA), 2-phosphonobutane-1,2,4-tricarboxylic acid (PBTCA), ethylendiamine disuccinic acid, and propylenediamine tetraacetic acid; phosphonic acid; phosphonic acid derivatives such as hydroxyethylidene diphosphonic acid (HEDP) (Dequest 2010), 1-hydroxyethane-1,1-diphosphonic acid, nitrilo-tris(methylenephosphonic acid) (NTMP), amino tri(methylene phosphonic acid) (Dequest 2000), diethylenetriamine penta(methylene phosphonic acid) (Dequest 2060S), ethylenediamine tetra(methylene phosphonic acid) (EDTMPA); and combinations thereof. Alternatively, or in addition to, the at least one complexing agent can include an anionic surfactant including, but not limited to, sodium alkyl sulfates such as sodium ethylhexyl sulfate (NIAPROOF® 08), ammonium alkyl sulfates, alkyl ($C_{10}$-$C_{18}$) carboxylic acid ammonium salts, sodium sulfosuccinates and esters thereof, e.g., dioctyl sodium sulfosuccinate, alkyl ($C_6$-$C_{18}$) sulfonic acid sodium salts, and the di-anionic sulfonate surfactants. Preferred anionic surfactants include diphenyloxide disulfonates, such as the DOWFAX line of anionic surfactants available from Dow Chemical, including DOWFAX 2A1 (sodium tetrapropyl diphenyloxide disulfonate), DOWFAX 3A2, DOWFAX 8390, and DowFax™C6L (alkyldiphenyloxide disulfonate), as well as RHODACAL DSB available from Rhone-Poulenc, POLY-TERGENT 2A1, POLY-TERGENT 2EP available from Olin, AEROSOL DPOS-45 available from Cytec, CALFAX DBA-40, CALFAX 16L-35 available from Pilot Chemicals, and the like. Diphenyloxide disulfonate surfactants represent a class of highly anionic surface active agents consisting of disulfonated alkyl diphenyl oxide molecules in which the charge arises from two sulfonate groups and provides excellent emulsion stability. Alternatively, or in addition to, the at least one complexing agent can include antiscalant polymers including, but not limited to, polyaminoamide (PAMAM) dendrimers, poly(2-ethyl-2-oxazoline), polyethyleneimine (PEI), a hydroxylated polyethylenimine, a modified polyethylenimine, polyallylamine hydrochloride (PALAM), poly(acrylamide), poly(acrylic acid), poly(diallyldimethylammonium chloride), diallyldimethylammonium chloride, acrylamide, acetoguanamine, poly(acrylamide-co-diallyl-dimethylammonium chloride) (PAMALAM), and combinations thereof. Alternatively, or in addition to, the complexing agents include salts which comprise an ammonium cation or a tetraalkylammonium cation ([$NR^1R^2R^3R^4$]$^+$, where $R^1$, $R^2$, $R^3$ and $R^4$ may be the same as or different from one another and are selected from the group consisting of hydrogen and $C_1$-$C_6$ alkyl (e.g., methyl, ethyl, propyl, butyl, pentyl, hexyl)), and an anion selected from the group consisting of acetate, chloride, bromide, iodide, sulfate, benzoate, propionate, citrate, formate, oxalate, tartarate, succinate, lactate, maleate, malonate, fumarate, malate, ascorbate, mandelate, and phthalate. For example, the salts can include ammonium bromide and/or ammonium chloride. Most preferably, the complexing agent comprises at least one of alkyldiphenyloxide disulfonate, 2,4-pentanedione, serine, and any combination thereof.

When the oxidizing agent comprises iodate or periodate, an iodine scavenger may optionally be added to the semi-aqueous composition. Although not wishing to be bound by theory, it is thought that as the iodate or periodate are reduced, iodine accumulates, which increases the rate of copper etch. Iodine scavengers include, but are not limited to, ketones more preferably ketones with hydrogen(s) alpha to the carbonyl such as 4-methyl-2-pentanone, 2,4-dimethyl-3-pentanone, cyclohexanone, 5-methyl-3-heptanone, 3-pentanone, 5-hydroxy-2-pentanone, 2,5-hexanedione, 4-hydroxy-4-methyl-2-pentanone, acetone, butanone, 2-methyl-2-butanone, 3,3-dimethyl-2-butanone, 4-hydroxy-2-butanone, cyclopentanone, 2-pentanone, 3-pentanone, 1-phenylethanone, acetophenone, benzophenone, 2-hexanone, 3-hexanone, 2-heptanone, 3-heptanone, 4-heptanone, 2,6-dimethyl-4-heptanone, 2-octanone, 3-octanone, 4-octanone, dicyclohexyl ketone, 2,6-dimethylcyclohexanone, 2-acetylcyclohexanone, 2,4-pentanedione, menthone, and combinations thereof. Preferably, the iodine scavenger includes 4-methyl-2-pentanone, 2,4-dimethyl-3-pentanone, or cyclohexanone.

In another embodiment, any of the compositions of the invention may further comprise titanium nitride and/or photoresist etch material residue, wherein the residue is suspended and/or dissolved in the aqueous composition.

In one embodiment, the composition of the first aspect comprises, consists of, or consists essentially of at least one oxidizing agent, at least one etchant, at least one corrosion inhibitor, at least one passivating agent, at least one solvent, and optionally at least one complexing agent, wherein the composition is substantially devoid of hydrogen peroxide, present in the following ranges, based on the total weight of the composition:

| component | % by weight | more preferred % by weight | most preferred % by weight |
|---|---|---|---|
| oxidizing agent(s) | about 0.001 wt % to about 2 wt % | about 0.001 wt % to about 1 wt % | about 0.001 wt % to about 0.2 wt % |
| etchant(s) | about 0.01 wt % to about 10 wt % | about 0.01 wt % to about 5 wt % | about 0.1 wt % to about 3 wt % |
| corrosion inhibitor(s) | about 0.0001 wt % to about 2 wt % | about 0.0001 wt % to about 1 wt % | about 0.0001 wt % to about 0.5 wt % |
| passivating agent(s) | about 0.001 wt % to about 2 wt % | about 0.001 wt % to about 2 wt % | about 0.001 wt % to about 2 wt % |
| solvent(s) | about 88 wt % to about 99.99 wt % | about 94 wt % to about 99.99 wt % | about 95 wt % to about 99.9 wt % |
| optional complexing agent(s) | 0 wt % to about 2 wt % | 0 wt % to about 1 wt % | 0 wt % to about 1 wt % |

In another embodiment, the composition of the first aspect comprises, consists of, or consists essentially of at least one iodine-containing oxidizing agent, at least one etchant, at least one corrosion inhibitor, at least one passivating agent, at least one solvent, at least one iodine scavenger, and optionally at least one complexing agent, wherein the composition is substantially devoid of hydrogen peroxide, present in the following ranges, based on the total weight of the composition:

| component | % by weight | more preferred % by weight | most preferred % by weight |
|---|---|---|---|
| iodine-containing oxidizing agent(s) | about 0.001 wt % to about 2 wt % | about 0.001 wt % to about 1 wt % | about 0.001 wt % to about 0.2 wt % |

-continued

| component | % by weight | more preferred % by weight | most preferred % by weight |
|---|---|---|---|
| etchant(s) | about 0.01 wt % to about 10 wt % | about 0.01 wt % to about 5 wt % | about 0.1 wt % to about 3 wt % |
| corrosion inhibitor(s) | about 0.0001 wt % to about 2 wt % | about 0.0001 wt % to about 1 wt % | about 0.0001 wt % to about 0.5 wt % |
| passivating agent(s) | about 0.001 wt % to about 2 wt % | about 0.001 wt % to about 2 wt % | about 0.001 wt % to about 2 wt % |
| solvent(s) | about 88 wt % to about 99.99 wt % | about 94 wt % to about 99.99 wt % | about 95 wt % to about 99.9 wt % |
| iodine scavenger(s) | about 0.001 wt % to about 1 wt % | about 0.01 wt % to about 0.5 wt % | about 0.01 wt % to about 0.5 wt % |
| optional complexing agent(s) | 0 wt % to about 2 wt % | 0 wt % to about 1 wt % | 0 wt % to about 1 wt % |

Preferably, an embodiment of the removal composition of the first aspect comprises, consists of, or consists essentially of at least one periodate oxidizing agent, at least one etchant, at least one solvent, at least one corrosion inhibitor, and at least one passivating agent, wherein the composition is substantially devoid of hydrogen peroxide. More preferably, the removal composition of this embodiment comprises, consists of, or consists essentially of at least one periodate oxidizing agent, hexafluorosilicic acid, water, at least one corrosion inhibitor, and at least one passivating agent, wherein the composition is substantially devoid of hydrogen peroxide. Even more preferably, the removal composition of this embodiment comprises, consists of, or consists essentially of periodic acid, hexafluorosilicic acid, water, TMAS, and at least one corrosion inhibitor, wherein the composition is substantially devoid of hydrogen peroxide. Most preferably, the removal composition of this embodiment comprises, consists of, or consists essentially of periodic acid, hexafluorosilicic acid, water, TMAS, and at least one corrosion inhibitor selected from benzalkonium chloride, amine-N-oxide, amine oxide surfactants and/or Tomamine® ether amines, wherein the composition is substantially devoid of hydrogen peroxide.

Preferably, another embodiment of the removal composition of the first aspect comprises, consists of, or consists essentially of at least one oxidizing agent, at least one etchant, at least one solvent, at least one amine oxide corrosion inhibitor, and at least one passivating agent, wherein the composition is substantially devoid of hydrogen peroxide. More preferably, the removal composition of this embodiment comprises, consists of, or consists essentially of at least one oxidizing agent, tetrafluoroboric acid, water, at least one passivating agent, and at least one corrosion inhibitor selected amine-N-oxide, amine oxide surfactants and/or Tomamine® ether amines, wherein the composition is substantially devoid of hydrogen peroxide. Even more preferably, the removal composition of this embodiment comprises, consists of, or consists essentially of at least one oxidizing agent, tetrafluoroboric acid, water, boric acid or a borate salt, and at least one corrosion inhibitor selected from benzalkonium chloride, amine-N-oxide, amine oxide surfactants and/or Tomamine® ether amines, wherein the composition is substantially devoid of hydrogen peroxide.

In another embodiment, the removal composition of the first aspect comprises, consists of, or consists essentially of at least one iodate oxidizing agent, at least one etchant, at least one solvent, at least one corrosion inhibitor, at least one iodine scavenger, and at least one passivating agent, wherein the composition is substantially devoid of hydrogen peroxide. More preferably, the removal composition of this embodiment comprises, consists of, or consists essentially of at least one iodate oxidizing agent, hexafluorosilicic acid, water, at least one corrosion inhibitor, at least one iodine scavenger, and at least one passivating agent, wherein the composition is substantially devoid of hydrogen peroxide.

It will be appreciated that it is common practice to make concentrated forms of the composition to be diluted prior to use. For example, the composition may be manufactured in a more concentrated form and thereafter diluted with at least one solvent at the manufacturer, before use, and/or during use at the fab. Dilution ratios may be in a range from about 0.1 part diluent:1 part composition concentrate to about 100 parts diluent:1 part composition concentrate. It should further be appreciated that the compositions described herein include oxidizing agents, which can be unstable over time. Accordingly, the concentrated form can be substantially devoid of oxidizing agent(s) and the oxidizing agent can be introduced to the concentrate or the diluted composition by the manufacturer before use and/or during use at the fab.

The compositions described herein are easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the composition, i.e., more dilute or more concentrated, and it will be appreciated that the compositions can variously and alternatively comprise, consist or consist essentially of any combination of ingredients consistent with the disclosure herein.

Accordingly, a second aspect relates to a kit including, in one or more containers, one or more components adapted to form the compositions described herein. The containers of the kit must be suitable for storing and shipping said removal composition components, for example, NOWPak® containers (Advanced Technology Materials, Inc., Danbury, Conn., USA). The one or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and PCT/US08/63276 entitled "SYSTEMS AND METHODS FOR MATERIAL BLENDING AND DISTRIBUTION" filed on May 9, 2008.

In a third aspect, the invention relates to methods of etching titanium nitride material from the surface of the microelectronic device having same thereon using a composition described herein. For example, titanium nitride material may be removed without substantially damaging/removing metal conductor and insulator materials that are present on the microelectronic device. Accordingly, in a preferred embodiment, a method of selectively and substantially removing titanium nitride and/or photoresist etch residue materials relative to metal conductor and insulator materials from the surface of the microelectronic device having same thereon is described using a composition described herein. In another preferred embodiment, a method of selectively and substantially removing titanium nitride and/or photoresist etch residue materials relative to metal conductor (e.g., copper), tungsten and insulator materials from the surface of the microelectronic device having same thereon is described using a composition described herein.

In etching applications, the composition is applied in any suitable manner to the surface of the microelectronic device having the titanium nitride and/or photoresist etch residue material thereon, e.g., by spraying the composition on the surface of the device, by dipping (in a static or dynamic volume of the composition) of the device including the titanium nitride and/or photoresist etch residue material, by contacting the device with another material, e.g., a pad, or fibrous sorbent applicator element, that has the composition absorbed thereon, by contacting the device including the titanium nitride and/or photoresist etch residue material with a circulating composition, or by any other suitable means, manner or technique, by which the composition is brought into removal contact with the titanium nitride and/or photoresist etch residue material. The application may be in a batch or single wafer apparatus, for dynamic or static cleaning. Advantageously, the compositions described herein, by virtue of their selectivity for titanium nitride and/or photoresist etch residue material relative to other materials that may be present on the microelectronic device structure and exposed to the composition, such as metals and insulating materials (i.e., low-k dielectrics), achieve at least partial removal of the titanium nitride and/or photoresist etch residue material in a highly efficient and highly selective manner.

In use of the compositions described herein for removing titanium nitride and/or photoresist etch residue material from microelectronic device structures having same thereon, the composition typically is contacted with the device structure in a single wafer tool for a sufficient time of from about 0.3 minute to about 30 minutes, preferably about 0.5 minutes to about 3 minutes, at temperature in a range of from about 20° C. to about 100° C., preferably about 30° C. to about 60° C. Such contacting times and temperatures are illustrative, and any other suitable time and temperature conditions may be employed that are efficacious to at least partially remove the titanium nitride and/or photoresist etch residue material from the device structure.

In one embodiment, the composition is heated inline during delivery to the device structure. By heating inline, rather than in the bath itself, the composition life increases.

Following the achievement of the desired etching/removal action, the composition can be readily removed from the microelectronic device to which it has previously been applied, e.g., by rinse, wash, or other removal step(s), as may be desired and efficacious in a given end use application of the compositions described herein. For example, the device may be rinsed with a rinse solution including deionized water and/or dried (e.g., spin-dry, $N_2$, vapor-dry etc.).

A fourth aspect of the invention relates to the improved microelectronic devices made according to the methods described herein and to products containing such microelectronic devices.

A fifth aspect relates to methods of manufacturing an article comprising a microelectronic device, said method comprising contacting the microelectronic device with a composition for sufficient time to etchingly remove titanium nitride and/or photoresist etch residue material from the surface of the microelectronic device having same thereon, and incorporating said microelectronic device into said article, wherein the composition comprises, consists of or consists essentially of at least one oxidizing agent, at least one etchant, at least one corrosion inhibitor, at least one low-k passivating agent, at least one solvent, and optionally at least one complexing agent, wherein the composition is substantially devoid of hydrogen peroxide. When the at least one oxidizing agent comprises an iodine-containing oxidizing agent, the composition can further include at least one iodine scavenger.

A sixth aspect of the invention relates to an article of manufacture comprising, consisting of or consisting essentially of a microelectronic device substrate, a titanium nitride layer on said substrate, and a composition described herein.

The features and advantages of the invention are more fully shown by the illustrative examples discussed below.

EXAMPLE 1

Formulations were prepared comprising: 0.01 wt % periodic acid, 1.80 wt % $H_2SiF_6$, 0.004 wt % benzalkonium chloride, 0.24 wt % TMAS, the indicated complexing agent and amount, balance water (to 100 wt %) and the etch rates of W, TiN, and TEOS were determined at 50° C.

TABLE 1

Formulations and etch rates.

| Formulation | complexing agent | W etch rate/Å/min | TEOS etch rate/Å/min | TiN etch rate/Å/min |
|---|---|---|---|---|
| A | 0.007 wt % DowFax C6L | <0.5 | 0.8 | 83.38 |
| B | 0.2 wt % L-serine | <0.5 | <0.5 | 60.61 |
| C | 0.1 wt % aspartic acid | 0.8 | <0.5 | 85.56 |
| D | 0.1 wt % glutamic acid | 0.8 | <0.5 | 88.47 |
| E | 0.2 wt % glutamine | 0.7 | <0.5 | 83.92 |
| F | 0.2 wt % glycine | 0.6 | <0.5 | 83.58 |
| G | 0.2 wt % DL-alanine | 0.6 | <0.5 | 84.99 |
| H | 0.2 wt % 2,4-pentanedione | 0.6 | <0.5 | 67.63 |
| I | 0.2 wt % succinic acid | 0.6 | <0.5 | 85.77 |
| J | 40% Carbitol | 2 | 1.3 | 66.41 |
| K | 40% DPGME | 2 | 1.2 | 69.73 |
| L | 0.14% Poly(2-ethyl-2-oxazoline) | <0.5 | 0.8 | 72.40 |
| M | 0 | <0.5 | <0.5 | 91.32 |
| N | 0 | <0.5 | <0.5 | 84.38 |

It can be seen that many of the compositions including the complexing agents resulted in a TiN etch rate that was equivalent to formulations M and N (i.e., without complexing agent) and had commensurate W etch rates and/or lower TEOS etch rates (formulations A-L).

Particle measurements were performed for many of the formulations, whereby the liquid particle count of 0.1 μm, 0.3 μm and 0.5 μm particles was determined over the course of approximately one week. It was determined that formulation A resulted in the most stability over time while formulation E was adequately stable.

EXAMPLE 2

Formulations were prepared comprising: 0.01 wt % ammonium iodate, 0.80 wt % $H_2SiF_6$, 0.005 wt % myristyl trimethyl ammonium bromide, 0.5 wt % MBTA, 0.2 wt % TEOS, 0.1 wt % 4-methyl-2-pentanone, the indicated complexing agent and amount, balance water (to 100 wt %) and the etch rates of Cu, W, TiN, and TEOS were determined at 50° C.

TABLE 2

Formulations and etch rates.

| Formulation | complexing agent | Cu etch rate/ | W etch rate/Å/min | TEOS etch rate/Å/min | TiN etch rate/Å/min |
|---|---|---|---|---|---|
| Q | 0.002 wt % DowFax C6L | 1.5 | 1.7 | <0.5 | 57.69 |
| R | 0.2 wt % glutamine | 0.9 | 1.5 | <0.5 | 40.25 |
| S | 0.2 wt % glycine | 0.7 | 1.6 | <0.5 | 41.67 |
| T | 0.2 wt % DL-alanine | 1.0 | 1.5 | <0.5 | 42.33 |
| U | 0.2 wt % 2,4-pentanedione |  | 1.80 | <0.5 | 59.68 |
| W | 0.2 wt % succinic acid |  | 1.2 | <0.5 | 61.29 |
| Y | 0 |  | 2.5 | <0.5 | 48.01 |
| Z | 0 |  | 2.1 | <0.5 | 61.12 |

It can be seen that many of the compositions including the complexing agents resulted in a TiN etch rate that was equivalent to formulations Y and Z (i.e., without complexing agent) and had lower W etch rates and/or lower TEOS etch rates.

EXAMPLE 3

Formulations were prepared comprising: 0.01 wt % periodic acid, 1.80 wt % $H_2SiF_6$, 0.24 wt % TMAS, the indicated corrosion inhibitor and amount, balance water (to 100 wt %) and the etch rates of W, TiN, and PETEOS were determined following immersion of a coupon of same in a formulation for 20 minutes at 50° C. Corrosion inhibitors containing chlorides and bromides were ion-exchanged prior to formulation.

TABLE 3

Formulations and etch rates.

| Formulation | corrosion inhibitor | W etch rate/Å/min | PETEOS etch rate/Å/min | TiN etch rate/Å/min |
|---|---|---|---|---|
| AA |  | >10 |  |  |
| AB | 0.004 wt % benzalkonium chloride | <1 | <0.5 | >90 |
| AC | 0.01 wt % dodecyl(2-hydroxyethyl)dimethyl ammonium bromide | 1-2 |  | 70-80 |
| AD | 0.001 wt % hexadecyl(2-hydroxyethyl)dimethyl ammonium chloride | 2-3 |  | 70-80 |
| AE | 0.02 wt % cetyltrimethylammonium p-toluenesulfonate | 1-2 |  | 80-90 |
| AF | 0.01 wt % dodecylpyridium (laurylpyridinium) chloride | 1-2 |  | 80-90 |
| AG | 0.03 wt % dodecyltrimethylammonium methanesulfonate | 1-2 | <0.5 | 80-90 |
| AH | 0.03 wt % dodecyltrimethylammonium p-toluenesulfonate | 1-2 | <0.5 | 80-90 |
| AI | Tomamine AO-14-2 | 1-2 | <0.5 | 70-80 |
| AJ | Tomamine Q-17-2 (PG) | 2-3 | 0.5-1 | 60-70 |
| AK | Tomamine AO-14-2PG | <1 | <0.5 | 70-80 |
| AL | 0.01 wt % dodecyldimethylamine oxide | 2-3 | <0.5 | >90 |
| AM | 0.01 wt % Aromox C/12W | <1 | <0.5 | 80-90 |
| AN | 0.02 wt % Aromox DMC | 1-2 | 0.5-1 | 80-90 |
| AO | 0.01 wt % Rhodamine B | <1 | <0.5 | >90 |
| AP | 0.2 wt % 4-(benzyloxy)pyridine N-oxide | 1-2 | <0.5 | 70-80 |
| AQ | 0.1 wt % 4-(3-phenylpropyl)pyridine N-oxide | 1-2 | <0.5 | 70-80 |
| AR | 4-(4-Nitrobenzyl)pyridine | 1-2 | <0.5 | 70-80 |

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A composition for selectively removing titanium nitride and/or photoresist etch residue material from the surface of a microelectronic device having same thereon, said composition comprising at least one oxidizing agent, at least one etchant, at least one corrosion inhibitor, at least one passivating agent, at least one solvent, and optionally at least one complexing agent, wherein the oxidizing agent comprises a species selected from the group consisting of $FeCl_3$ (both hydrated and unhydrated), $Fe(NO_3)_3$, $Sr(NO_3)_2$, $CoF_3$, $FeF_3$, $MnF_3$, oxone ($2KHSO_5 \cdot KHSO_4 \cdot K_2SO_4$), periodic acid, iodic acid, vanadium (V) oxide, vanadium (IV,V) oxide, ammonium vanadate, ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), ammonium hypochlorite ($NH_4ClO$), ammonium tungstate (($NH_4)_{10}H_2(W_2O_7)$), sodium persulfate ($Na_2S_2O_8$), sodium hypochlorite ($NaClO$), sodium perborate, potassium iodate ($KIO_3$), potassium permanganate ($KMnO_4$), potassium persulfate, nitric acid ($HNO_3$), potassium persulfate ($K_2S_2O_8$), potassium hypochlorite ($KClO$), tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$), tetrabutylammonium peroxomonosulfate, peroxomonosulfuric acid, ferric nitrate ($Fe(NO_3)_3$), peracetic acid ($CH_3(CO)OOH$), toluquinone, dimethyl-1,4-benzoquinone, chloranil, alloxan, and combinations thereof;

wherein the composition is substantially devoid of hydrogen peroxide, and wherein the at least one corrosion inhibitor is selected from the group consisting of:
a species selected from the group consisting of pyridine-N-oxide, N-ethylmorpholine-N-oxide, N-methylpyrrolidine-N-oxide, and N-ethylpyrrolidine-N-oxide;
a heterocycle selected from the group consisting of quinoline, quinazoline, isoquinoline, pyrazine, quinoxaline, phenazine, phenanthridine, and acridine;
a heterocycle selected from the group consisting of quinolone, quinazoline, isoquinoline, pyrazine, quinoxaline, phenazine, phenanthridine, and acridine, the heterocycle comprising at least one substituent selected from the group consisting of phenyl, benzyl, phenethyl, 3-phenylpropyl, and benzyloxy.

2. The composition of claim 1, wherein the etchant comprises a species selected from the group consisting of $H_2ZrF_6$, $H_2TiF_6$, $HPF_6$, HF, ammonium fluoride, tetrafluoroboric acid, hexafluorosilicic acid, tetrabutylammonium tetrafluoroborate ($TBA-BF_4$), ammonium hexafluorosilicate, ammonium hexafluorotitanate, tetraalkylammonium fluoride ($NR_1R_2R_3R_4F$), tetraalkylammonium hydroxide ($NR_1R_2R_3R_4OH$), weak bases, and combinations thereof, where $R_1$, $R_2$, $R_3$, $R_4$ may be the same as or different from one another and is selected from the group consisting of straight-chained $C_1$-$C_6$ alkyl groups, branched $C_1$-$C_6$ alkyl groups, substituted aryl groups, and unsubstituted aryl groups.

3. The composition of claim 1, wherein the etchant comprises HF, hexafluorosilicic acid or tetrafluoroboric acid.

4. The composition of claim 1, wherein the oxidizing agent comprises an iodate or a periodate, and the composition further comprises an iodine scavenger.

5. The composition of claim 1, wherein the oxidizing agent comprises a species selected from the group consisting of vanadium oxide, ammonium iodate, ammonium periodate, ammonium vanadate, periodic acid, iodic acid, and combinations thereof.

6. The composition of claim 1, wherein the at least one solvent comprises water.

7. The composition of claim 6, wherein the composition comprises at least about 95 wt % water, based on the total weight of the composition.

8. The composition of claim 1, wherein the at least one solvent comprises a species selected from the group consisting of methanol, ethanol, isopropanol, butanol, and higher alcohols, tetrahydrofurfuryl alcohol (THFA), 3-chloro-1,2-propanediol, 3-chloro-1-propanethiol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 4-chloro-1-butanol, 2-chloroethanol), dichloromethane, chloroform, acetic acid, propionic acid, trifluoroacetic acid, tetrahydrofuran (THF), N-methylpyrrolidinone (NMP), cyclohexylpyrrolidinone, N-octylpyrrolidinone, N-phenylpyrrolidinone, methyldiethanolamine, methyl formate, dimethyl formamide (DMF), dimethylsulfoxide (DMSO), tetramethylene sulfone (sulfolane), diethyl ether, phenoxy-2-propanol (PPh), propriophenone, ethyl lactate, ethyl acetate, ethyl benzoate, acetonitrile, acetone, ethylene glycol, propylene glycol (PG), 1,3-propanediol, 1,4-propanediol, dioxane, butyryl lactone, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, dipropylene glycol methyl ether acetate, tetraethylene glycol dimethyl ether (TEGDE), dibasic ester, glycerine carbonate, N-formyl morpholine, triethyl phosphate, and combinations thereof.

9. The composition of claim 1, wherein the at least one passivating agent comprises a species selected from the group consisting of methyltrimethoxysilane, dimethyldimethoxysilane, phenyltrimethoxysilane, tetraethoxysilane (TEO S), N-propyltrimethoxysilane, N-propyltriethoxysilane, hexyltrimethoxysilane, hexyltriethoxysilane, ammonium hexaflurorosilicate, sodium silicate, tetramethyl ammonium silicate (TMAS), boric acid, ammonium pentaborate, sodium tetraborate, ammonium biborate, 3-hydroxy-2-naphthoic acid, malonic acid, iminodiacetic acid, and combinations thereof.

10. The composition of claim 1, comprising the at least one complexing agent, wherein the at least one complexing agent comprises a species selected from the group consisting of 2,4-pentanedione, acetylacetonate, 1,1,1-trifluoro-2,4-pentanedione, 1,1,1,5,5,5-hexafluoro-2,4-pentanedione, glycine, serine, proline, leucine, alanine, asparagine, aspartic acid, glutamine, histidine, glutamic acid, arginine, cysteine, valine, lysine, iminodiacetic acid (IDA), malonic acid, oxalic acid, succinic acid, boric acid, nitrilotriacetic acid, malic acid, citric acid, acetic acid, maleic acid, ethylenediaminetetraacetic acid (EDTA), EDTA-2NH$_3$ (ethylenediaminetetraacetic acid diammonium salt), (1,2-cyclohexylenedinitrilo)tetraacetic acid (CDTA), diethylenetriamine pentaacetic acid (DTPA), 2-phosphonobutane-1,2,4-tricarboxylic acid (PBTCA), ethylendiamine disuccinic acid, propylenediamine tetraacetic acid, hydroxyethylidene diphosphonic acid (HEDP), 1-hydroxyethane-1,1-diphosphonic acid, nitrilo-tris(methylenephosphonic acid) (NTMP), amino tri (methylene phosphonic acid), diethylenetriamine penta(methylene phosphonic acid), ethylenediamine tetra (methylene phosphonic acid) (EDTMPA), sodium alkyl sulfates, ammonium alkyl sulfates, alkyl ($C_{10}$-$C_{18}$) carboxylic acid ammonium salts, sodium sulfosuccinates and esters thereof, alkyl ($C_6$-$C_{18}$) sulfonic acid sodium salts, di-anionic sulfonates, antiscalant polymers, and combinations thereof.

11. The composition of claim 1, wherein the composition is substantially devoid of amines, abrasive materials, metal halides, and combinations thereof.

12. The composition of claim 1, wherein the pH of the composition is in a range of from 0 to 4.

13. A method of etching titanium nitride material from a surface of a microelectronic device having same thereon, said method comprising contacting the surface with a composition, wherein the composition selectively removes the titanium nitride material from the surface relative to metals and insulating materials, and wherein the composition comprises at least one oxidizing agent, at least one etchant, at least one corrosion inhibitor, at least one passivating agent, at least one solvent, and optionally at least one complexing agent, wherein the oxidizing agent comprises a species selected from the group consisting of $FeCl_3$ (both hydrated and unhydrated), $Fe(NO_3)_3$, $Sr(NO_3)_2$, $CoF_3$, $FeF_3$, $MnF_3$, oxone ($2KHSO_5 \cdot KHSO_4 \cdot K_2SO_4$), periodic acid, iodic acid, vanadium (V) oxide, vanadium (IV,V) oxide, ammonium vanadate, ammonium peroxomonosulfate, ammonium chlorite ($NH_4CO_2$), ammonium chlorate ($NH_4ClO_3$), ammonium iodate ($NH_4IO_3$), ammonium nitrate ($NH_4NO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), ammonium hypochlorite ($NH_4ClO$), ammonium tungstate (($NH_4)_{10}H_2(W_2O_7)$), sodium persulfate ($Na_2S_2O_8$), sodium hypochlorite (NaClO), sodium perborate, potassium iodate ($KIO_3$), potassium permanganate ($KMnO_4$), potassium persulfate, nitric acid ($HNO_3$), potassium persulfate ($K_2S_2O_8$), potassium hypochlorite (KClO), tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$), tetrabutylammonium peroxomonosulfate, peroxomonosulfuric acid, ferric nitrate ($Fe(NO_3)_3$), peracetic acid ($CH_3(CO)OOH$), toluquinone, dimethyl-1,4-benzoquinone, chloranil, alloxan, and combinations thereof;

wherein the composition is substantially devoid of hydrogen peroxide, and wherein the at least one corrosion inhibitor is selected from the group consisting of:
a species selected from the group consisting of pyridine-N-oxide, N-ethylmorpholine-N-oxide, N-methylpyrrolidine-N-oxide, and N-ethylpyrrolidine-N-oxide;
a heterocycle selected from the group consisting of quinoline, quinazoline, isoquinoline, pyrazine, quinoxaline, phenazine, phenanthridine, and acridine; and
a heterocycle selected from the group consisting of quinolone, quinazoline, isoquinoline, pyrazine, quinoxaline, phenazine, phenanthridine, and acridine, the heterocycle comprising at least one substituent selected from the group consisting of phenyl, benzyl, phenethyl, 3-phenylpropyl, and benzyloxy.

14. The method of claim 13, wherein the oxidizing agent comprises an iodate or a periodate, and the composition further comprises an iodine scavenger.

15. The method of claim 13, wherein the oxidizing agent comprises a species selected from the group consisting of vanadium oxide, ammonium iodate, ammonium periodate, ammonium vanadate, periodic acid, iodic acid, and combinations thereof.

* * * * *